US012183383B2

(12) United States Patent
Cowles et al.

(10) Patent No.: US 12,183,383 B2
(45) Date of Patent: Dec. 31, 2024

(54) METHODS FOR ROW HAMMER MITIGATION AND MEMORY DEVICES AND SYSTEMS EMPLOYING THE SAME

(71) Applicant: Lodestar Licensing Group LLC, Evanston, IL (US)

(72) Inventors: Timothy B. Cowles, Boise, ID (US); Dean D. Gans, Nampa, ID (US); Jiyun Li, Boise, ID (US); Nathaniel J Meier, Boise, ID (US); Randall J. Rooney, Boise, ID (US)

( * ) Notice: Subject to any disclaimer, the term of this patent is extended or adjusted under 35 U.S.C. 154(b) by 0 days.

(21) Appl. No.: 18/384,682

(22) Filed: Oct. 27, 2023

(65) Prior Publication Data
US 2024/0127878 A1      Apr. 18, 2024

Related U.S. Application Data

(63) Continuation of application No. 17/387,934, filed on Jul. 28, 2021, now Pat. No. 11,810,610, which is a
(Continued)

(51) Int. Cl.
G11C 11/406      (2006.01)
(52) U.S. Cl.
CPC ... G11C 11/40611 (2013.01); G11C 11/40618 (2013.01)
(58) Field of Classification Search
CPC .................... G11C 11/40611; G11C 11/40618
(Continued)

(56) References Cited

U.S. PATENT DOCUMENTS 6,147,921 A    11/2000  Novak et al.
6,310,814 B1   10/2001  Hampel et al.
(Continued)

FOREIGN PATENT DOCUMENTS

CN    107025927 A    8/2017
CN    108154895 A    6/2018
(Continued)

OTHER PUBLICATIONS

Chinese Patent Office, "Office Action," issued in connection with Chinese Patent Application No. 201980066032.2 dated Sep. 12, 2023 (12 pages) (5 pages of English Translation and 7 pages of Original Document).
(Continued)

Primary Examiner — Huan Hoang

(57) ABSTRACT

Memory devices and methods of operating memory devices in which refresh management operations can be scheduled on an as-needed basis for those memory portions where activity (e.g., activations in excess of a predetermined threshold) warrants a refresh management operation are disclosed. In one embodiment, an apparatus comprises a memory including a memory location, and circuitry configured to determine a count corresponding to a number of activations at the memory location, to schedule a refresh management operation for the memory location in response to the count exceeding a first predetermined threshold, and to decrease the count by an amount corresponding to the first predetermined threshold in response to executing the scheduled refresh management operation. The circuitry may be further configured to disallow, in response to determining that the count has reached a maximum permitted value, further activations at the memory location until after the count has been decreased.

33 Claims, 4 Drawing Sheets

Related U.S. Application Data continuation of application No. 16/597,694, filed on Oct. 9, 2019, now Pat. No. 11,087,819.

(60) Provisional application No. 62/743,381, filed on Oct. 9, 2018.

(58) Field of Classification Search
USPC .......................................................... 365/222
See application file for complete search history.

(56) References Cited

U.S. PATENT DOCUMENTS

| | | |
|---|---|---|
| 8,941,935 B1 | 1/2015 | Aho et al. |
| 9,384,821 B2 | 7/2016 | Bains et al. |
| 9,761,298 B2 | 9/2017 | Halbert et al. |
| 9,812,185 B2 | 11/2017 | Fisch et al. |
| 10,049,755 B2 | 8/2018 | Lee et al. |
| 10,156,998 B1 | 12/2018 | Colgrove et al. |
| 10,817,371 B2 | 10/2020 | Rooney et al. |
| 11,087,819 B2 | 8/2021 | Cowles et al. |
| 2008/0183916 A1 | 7/2008 | Bellows et al. |
| 2008/0232184 A1 | 9/2008 | Ohsawa |
| 2010/0157650 A1 | 6/2010 | Hashimoto et al. |
| 2011/0255357 A1 | 10/2011 | Pelley et al. |
| 2012/0155201 A1 | 6/2012 | Schreck et al. |
| 2013/0304982 A1 | 11/2013 | Jung et al. |
| 2014/0006703 A1 | 1/2014 | Bains et al. |
| 2014/0059287 A1 | 2/2014 | Bains et al. |
| 2014/0095780 A1 | 4/2014 | Bains et al. |
| 2014/0122788 A1 | 5/2014 | Swaminathan |
| 2014/0156923 A1 | 6/2014 | Bains et al. |
| 2014/0173239 A1 | 6/2014 | Schushan |
| 2014/0192605 A1 | 7/2014 | Crawford et al. |
| 2015/0109871 A1 | 4/2015 | Bains et al. |
| 2015/0206558 A1 | 7/2015 | Ni et al. |
| 2015/0279441 A1 | 10/2015 | Greenberg et al. |
| 2015/0339188 A1 | 11/2015 | Hu et al. |
| 2016/0118132 A1 | 4/2016 | Prins et al. |
| 2017/0110178 A1 | 4/2017 | Bains |
| 2017/0186481 A1 | 6/2017 | Oh et al. |
| 2017/0213586 A1 | 7/2017 | Kang et al. |
| 2018/0004415 A1 | 1/2018 | Lee et al. |
| 2018/0025773 A1* | 1/2018 | Bains ................ G11C 11/40618 365/230.03 |
| 2018/0061483 A1 | 3/2018 | Morgan |
| 2020/0043545 A1 | 2/2020 | Gans |
| 2020/0111525 A1 | 4/2020 | Cowles et al. |
| 2020/0133517 A1 | 4/2020 | Shah et al. |
| 2020/0201698 A1 | 6/2020 | Gans |
| 2020/0210278 A1 | 7/2020 | Rooney et al. |
| 2021/0042185 A1 | 2/2021 | Rooney et al. |
| 2021/0065831 A1 | 3/2021 | Galbraith et al. |
| 2021/0280236 A1 | 9/2021 | Gans |

FOREIGN PATENT DOCUMENTS

| | | |
|---|---|---|
| KR | 10-2018-0003713 A | 1/2018 |
| WO | 2006/130276 A1 | 12/2006 |

OTHER PUBLICATIONS

EP Patent Application No. 19843248.6—European Search Report, dated Mar. 18, 2022, 8 pages.

EP Patent Application No. 19871839.7—European Search Report, dated Jun. 1, 2022, 10 pages.

International Preliminary Report on Patentability received for PCT Patent Application No. PCT/US2019/055447, mailed on Apr. 22, 2021, 7 pages.

International Preliminary Report on Patentability received for PCT Patent Application No. PCT/US2019/044857, mailed on Nov. 21, 2019, 9 pages.

International Preliminary Report on Patentability received for PCT Patent Application No. PCT/US2019/055447, mailed on Jan. 31, 2020, 8 pages.

International Search Report and Written Opinion received for PCT Patent Application No. PCT/US2019/065220, mailed on Apr. 9, 2020, 8 pages.

KR Patent Application No. 10-2021-7006048—Korean Office Action and Search Report, dated Dec. 15, 2021, with English Translation, 10 pages.

KR Patent Application No. 10-2021-7013688—Korean Office Action and Search Report, dated May. 10, 2022, with English Translation, 13 pages.

U.S. Appl. No. 16/530,092—Unpublished U.S. Patent Application by Dean D. Gans, filed Aug. 2, 2019, titled "Methods for Row Hammer Mitigation and Memory Devices and Systems Employing the Same", 34 pages.

* cited by examiner

METHODS FOR ROW HAMMER MITIGATION AND MEMORY DEVICES AND SYSTEMS EMPLOYING THE SAME

CROSS-REFERENCE TO RELATED APPLICATIONS

This application is a continuation of U.S. application Ser. No. 17/387,934, filed Jul. 28, 2021, which is a continuation of U.S. application Ser. No. 16/597,694, filed Oct. 9, 2019; which claims the benefit of U.S. Provisional Application No. 62/743,381, filed Oct. 9, 2018; each of which is incorporated herein by reference in its entirety.

This application contains subject matter related to an U.S. Patent Application by Dean D. Gans titled "METHODS FOR ROW HAMMER MITIGATION AND MEMORY DEVICES AND SYSTEMS EMPLOYING THE SAME". The related application is assigned to Micron Technology, Inc., and is identified as U.S. patent application Ser. No. 16/530,092, filed on Aug. 2, 2019. The subject matter thereof is incorporated herein by reference thereto.

TECHNICAL FIELD

The present disclosure generally relates to methods for row hammer mitigation and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Figure 1:
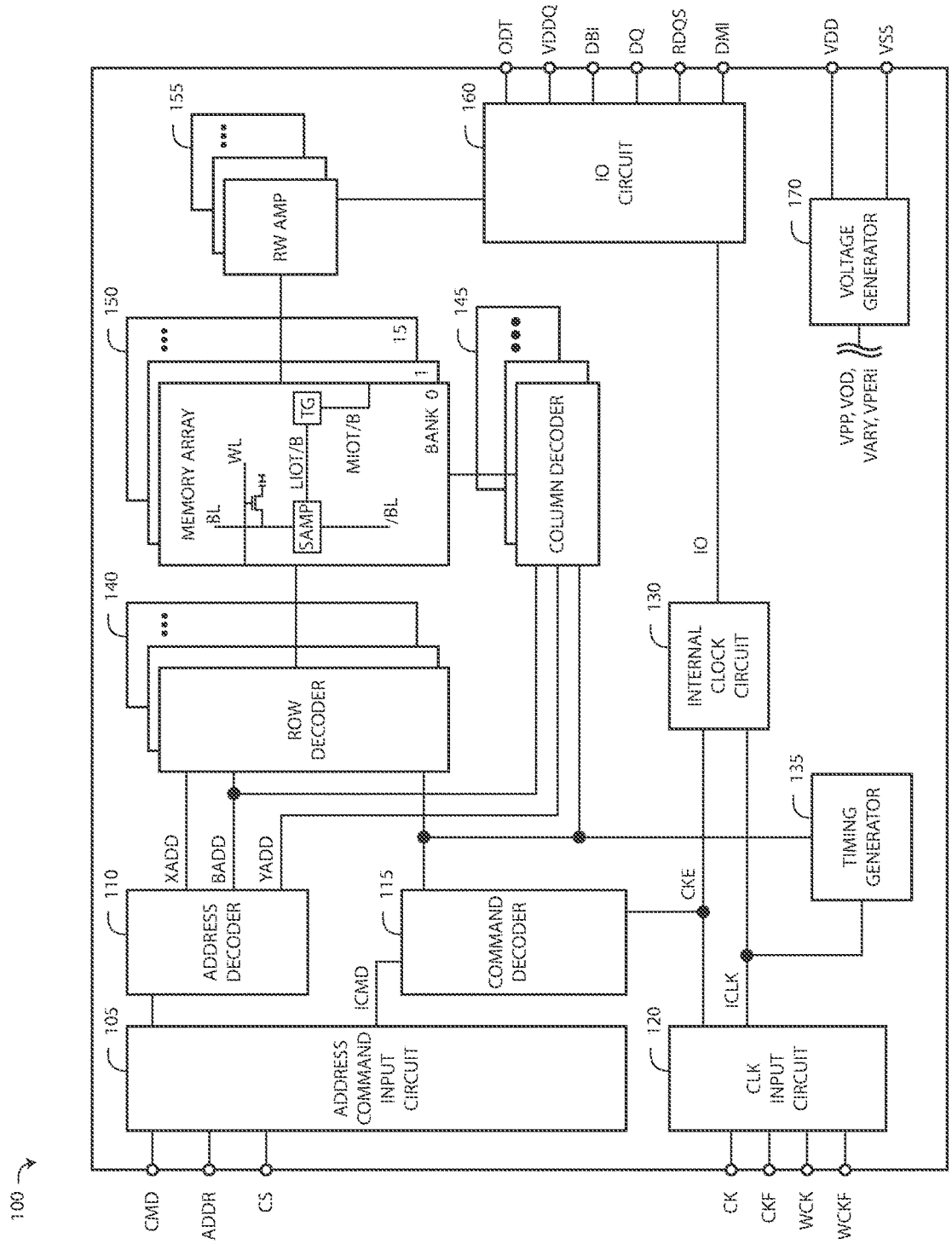
FIG. 1 is a simplified block diagram schematically illustrating a memory device in accordance with an embodiment of the present technology.

High data reliability, high speed of memory access, and reduced chip size are features that are demanded from semiconductor memory. Some semiconductor memory devices, such as DRAM, stores information as charge accumulated in cell capacitors that can be prone to leakage, and which therefore require periodic refresh operations to prevent the information from being lost. In addition to charge leakage, the information may be lost or degraded by bit errors caused by disturb mechanisms such as row hammer. Row hammer affects memory cells coupled to a non-selected word line adjacent to a selected word line that is repeatedly driven to an active level in a short time. The activity on the adjacent word line can cause the charge in the cells of the non-selected word line to vary, putting the information stored therein at risk, unless a refresh operation is executed to refresh the charge in the memory cells.

In some memory devices, auto-refresh (AREF) commands indicating refresh operations are periodically issued from a control device such as a host or a controller operably coupled to the memory device. The AREF commands are provided from the control device at a frequency that all the word lines are certainly refreshed once in the one refresh cycle. The duration of the refresh cycle may be selected according to an operating temperature of the memory device (e.g., with warmer temperatures generally warranting more frequent refresh operations) to prevent charge leakage from causing data degradation. As the refresh addresses according to the AREF commands are determined by a refresh counter provided in DRAM, refresh operations responsive to the AREF commands may not prevent bit errors due to row hammer effects.

One approach to ensuring that refresh operations are provided frequently enough to address row hammer effects involves increasing the frequency with which all of the memory portions are refreshed (e.g., by increasing the number of AREF commands issued in a given window of time). Because refresh operations can be power intensive, however, scheduling more frequent refresh operations for all of the memory portions based on a worst-case scenario of row hammer effects may be inefficient, and particularly undesirable for memory applications in which power consumption is a significant concern (e.g., mobile devices powered by a limited battery supply).

Another approach to addressing row hammer effects providing a memory device with circuitry to redirect or steal a portion of the available refresh opportunities (e.g., the regularly scheduled refresh commands received from a host device) to specific rows where hammer activity has been detected (e.g., adjacent to a row where a large number of activation commands have been executed). With the continual reduction in size of memory arrays, and the corresponding increase in sensitivity to row hammer effects, the number of activates that can be allowed to occur at an adjacent row before a row is refreshed continues to decrease. This presents a challenge for the refresh opportunity redirecting approach, as eventually there may no longer be enough refresh command time available to redirect for sufficient row hammer mitigation.

Accordingly, several embodiments of the present technology are directed to memory devices, systems including memory devices, and methods of operating memory devices in which refresh management operations can be scheduled on an as-needed basis for those memory portions where activity (e.g., activations in excess of a predetermined threshold) warrants a refresh management operation. In one embodiment, an apparatus comprises a memory including a memory location, and circuitry configured to determine a count corresponding to a number of activations at the memory location, to schedule a refresh management operation for the memory location in response to the count exceeding a first predetermined threshold, and to decrease the count by an amount corresponding to the first predetermined threshold in response to executing the scheduled refresh management operation. The circuitry may be further configured to schedule, before the execution of the first refresh management operation, a second refresh management operation in response to the count exceeding the first predetermined threshold, and to decrease the count by the amount corresponding to the first predetermined threshold in response to executing the second scheduled refresh management operation. The circuitry may be further configured to disallow, in response to determining that the count has reached a maximum permitted value, further activations at the memory location until after the count has been decreased.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology.

However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can be configured to execute refresh operations on portions of the memory array 150 in response to commands received from a connected host device or memory controller. The memory device 100 can track the addresses of the memory array 150 at which refresh operations are executed (e.g., in an address pointer), and can further track the number of refresh operations executed at the most recent address (e.g. in a bank counter). This arrangement can ensure that each bank 0-15 of the memory array 150 experiences at least one refresh operation (e.g., by counting sixteen operations) at a given address before the address pointer is incremented and the cycle is repeated.

According to one aspect of the present disclosure, a host device or controller operably connected to the memory device 100 can be configured to send refresh commands and/or refresh management commands to the memory device 100 to trigger the refresh/refresh management operations. Because these operations can prevent a memory device from communicating over the data bus for a number of clock cycles, efficient scheduling of bus utilization can be ensured by managing refresh and/or refresh management operations from the controller/host device.

As set forth above, row hammer effects can degrade the information stored in the memory array 150, such that modes of operation with greater delay between refresh operations can potentially put data integrity at risk. Accordingly, in various embodiments of the present disclosure, a host device or controller can be configured to issue refresh management commands (e.g., in addition to regularly-scheduled periodic refresh commands) to mitigate the effects of row hammer in the memory device 150. These refresh management commands may be scheduled at differing rates per time with flexibility in postponing a specified number of events to be made up at a later time.

According to one aspect of the present technology, a refresh management (RFM) command can differ from a refresh (REF) command, such that the memory device receiving the command can limit its refresh activity to victim rows, and not expend unnecessary time or power refreshing other rows that have not experienced row hammer effects. In this regard, in one embodiment of the present disclosure, a refresh command can be modified to include a command bit indicating whether it is a refresh management command (RFM), as shown in Table 1, below:

TABLE 1

| Function | CS | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| Refresh All (REFab) | L | H | H | L | L | H | CID3 | V | V | V | H | L | CID0 | CID1 | CID2/DDPID |
| Refresh Mgmt All (RFMab) | L | H | H | L | L | H | CID3 | V | V | V | L | L | CID0 | CID1 | CID2/DDPID |
| Refresh Same Bank (REFsb) | L | H | H | L | L | H | CID3 | BA0 | BA1 | V | H | H | CID0 | CID1 | CID2/DDPID |
| Refresh Mgmt Same Bank (RFMsb) | L | H | H | L | L | H | CID3 | BA0 | BA1 | V | L | H | CID0 | CID1 | CID2/DDPID |

In this regard, as can be seen with reference to Table 1, the value for CA9 is low ('L') when the command is a refresh management (RFM) command, and is high ('H') when the command is a refresh (REF) command.

One approach to mitigating row hammer effects with refresh management operations involves determining when a number of memory operations (e.g., activations) at a memory location (e.g., memory bank) exceeds a predetermined threshold, and scheduling a refresh management operation in response to the determination. Upon scheduling the refresh management operation, the tracked number of memory operations can be decreased by an amount corresponding to the predetermined threshold.

Figure 2:
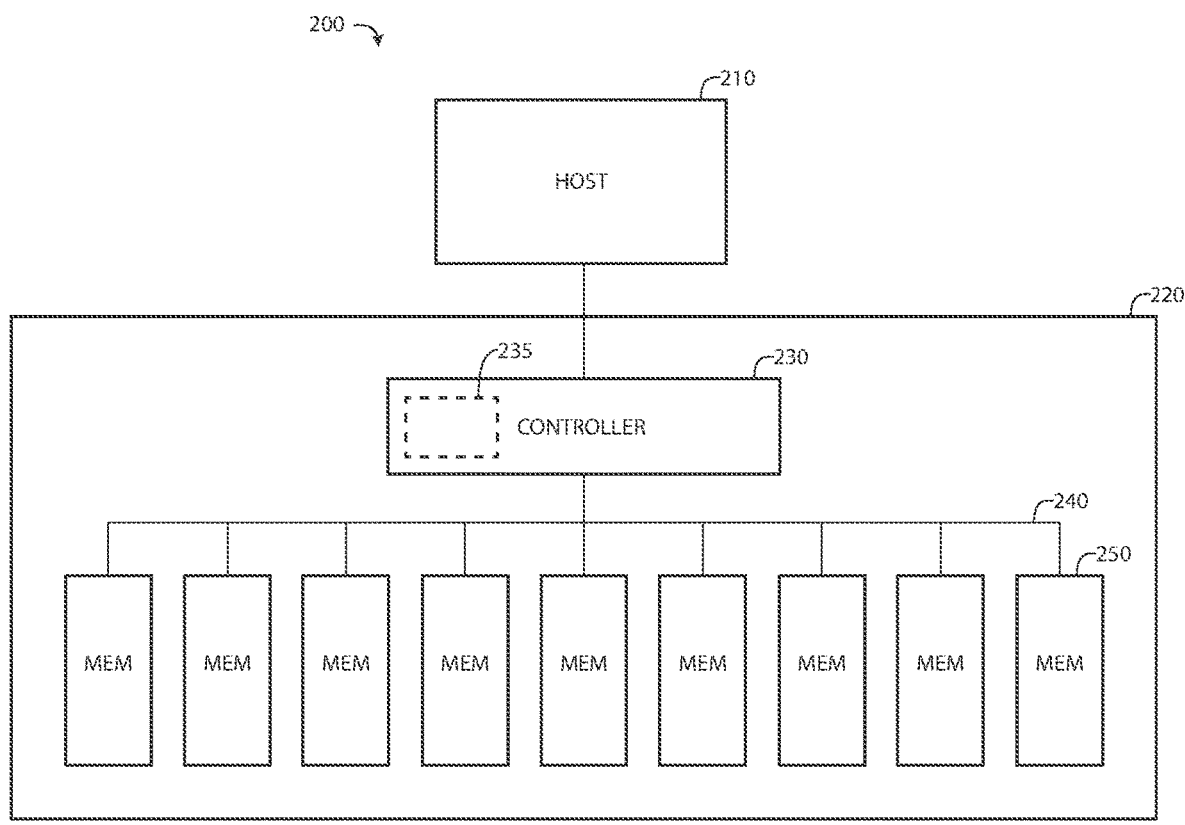
FIG. 2 is a simplified block diagram schematically illustrating a memory system 200 in accordance with an embodiment of the present technology.

This may be better understood with reference to FIG. 2, in which a simplified block diagram schematically illustrates a memory system 200 in accordance with an embodiment of the present technology. Memory system 200 includes a host device 210 operably coupled to a memory module 220 (e.g., a dual in-line memory module (DIMM)). Memory module 220 can include a controller 230 operably connected by a bus 240 to a plurality of memory devices 250. In accordance with one aspect of the present disclosure, the controller 230 (and/or the host device 210) can maintain a counter 235 to track operations (e.g., activations) per bank of each memory device 250 of the memory module 220 (e.g., a Rolling Accumulated Activations (RAA) counter). If the RAA is determined to exceed a specified threshold (e.g., a Maximum Activation Count (MAC) threshold), the controller 230 (and/or the host device 210) can issue, or schedule for later issuance, a refresh (REF) or refresh management (RFM) command to the impacted bank (or to a larger group of banks including the impacted bank, such as all banks of the memory device 220). When the REF or RFM operation thus commanded is executed by the memory device 250, the count can be decreased (e.g., by an amount corresponding to the MAC threshold.

For example, in an embodiment in which the MAC threshold is 16 activations, the RAA counter may determine that a bank of one of the memory devices has experienced a cumulative 18 activations. In response to the determination, the controller 230 (and/or the host device 210) can issue a RFM command to execute a row hammer mitigation refresh operation at the memory location of the bank that has been impacted by the large number of activations. Following the operation, the value in the RAA counter (e.g., at the host device 210 and/or the controller 230) can be decreased by 16 (e.g., leaving a value of 2).

In accordance with one aspect of the present disclosure, the amount by which the value in the RAA counter need not be the same amount as the MAC threshold, but may correspond to the amount of the MAC threshold in another way. For example, if the host device 210 issues a REF command rather than a RFM command, the value in the RAA counter may be decreased by a predetermined fraction (e.g., ½, ¾, etc.) of the MAC threshold. Other commands (e.g., REFab, REF fgr, RFMab, RFM fgr, etc.) may cause the value in the RAA counter to be decreased by other amounts that correspond to, rather than equal, the amount of the MAC threshold. By way of another example, a REF fgr command may decrease the amount of the RAA counter by ½ the amount by which a REF command decreases the amount in the RAA counter.

In accordance with another aspect of the present disclosure, the temperature of the memory device may be further used to modify the amount by which the RAA counter is decreased following the execution of refresh (e.g., REF, RFM, etc.) operation (e.g., where a higher temperature causes the amount by which the RAA counter is decreased to be less than an amount by which it is decreased at a lower temperature, or vice versa). Additionally, the current refresh rate of the memory device may similarly modify both the MAC value for each bank, and the amount by which the RAA counter is decreased.

In another example where the MAC threshold is 16 activations, the RAA counter may determine that a bank of one of the memory device has experienced 35 cumulative activations. In response, the host device 210 can schedule two RFM commands directed to the impacted memory bank that, when actually implemented by the memory device 250, will each decrease the value in the RAA counter by 16.

By permitting the scheduling of future REF or RFM commands in response to the RAA counter exceeding an initial management threshold, the memory module 220 can permit flexible bus scheduling by the host device 210 to address row hammer and other disturb mechanisms caused by activations. According to one aspect of the present disclosure, the memory module 220 can be configured to enforce a maximum value in the RAA counter for each bank (e.g., a RAA Maximum (RAAmax)), beyond which no further activations will be permitted before the value is decreased (e.g., decreased in response to the execution of a REF or RFM operation).

For example, in an embodiment in which the MAC threshold is 16 activations, and the maximum value permitted in the RAA counter is 64, the memory module 220 may permit the host device 210 (and/or the controller 230) to "postpone" up to four REF or RFM operations, but no more (e.g., as further activation commands directed to a bank in which the value for the RAA counter is 64 will be disallowed, preventing further increase in the RAA counter). In response to the execution of one scheduled RFM command, the value may be decreased by an amount corresponding to the MAC threshold value (e.g., decreased by 16), thereby permitting 16 further activations before the maximum value permitted in the RAA counter is again reached.

According to one aspect of the present disclosure, both the host device 210 and the memory controller 230 may be configured to maintain RAA counters for each bank of each memory device 250. In this approach, activation commands that would cause the RAA counter value for a bank to exceed the maximum permitted value can be disallowed (e.g., by the memory controller 230) if issued, and prevented from issuing (e.g., by the host device 210).

In accordance with an aspect embodiment of the present disclosure, the values for the MAC and RAAmax may be stored in a mode register of each memory device 250. This may permit these values to be changed (e.g., by an end-user, a vendor, a system integrator, etc.).

According to yet another aspect of the present disclosure, the MAC value specified for a memory device (e.g., in a mode register of the memory device) may be modified according to the current temperature of the memory device. In this regard, at higher temperatures, the MAC value may be decreased to better protect against row hammer effects that can more quickly accrue at higher operating temperatures. This feature may be implemented by storing MAC values in a look-up table (e.g., in a mode register or other storage location) sorted by temperature.

In accordance with another aspect of the present disclosure, the refresh management feature by which refresh management operations can be scheduled on an as-needed basis for those memory portions where activity (e.g., activations in excess of a predetermined threshold) warrants a refresh management operation can optionally be enabled or disabled based upon a user-selectable preference. For example, some devices that utilize one or more of the foregoing approaches to refresh management may be configured to disable the feature for one or more refresh rate multiplier(s). In this regard, when operating a memory device at slower refresh rates, utilizing the foregoing approach(es) to refresh management can help to ensure the integrity of data stored in the memory.

Figure 3:
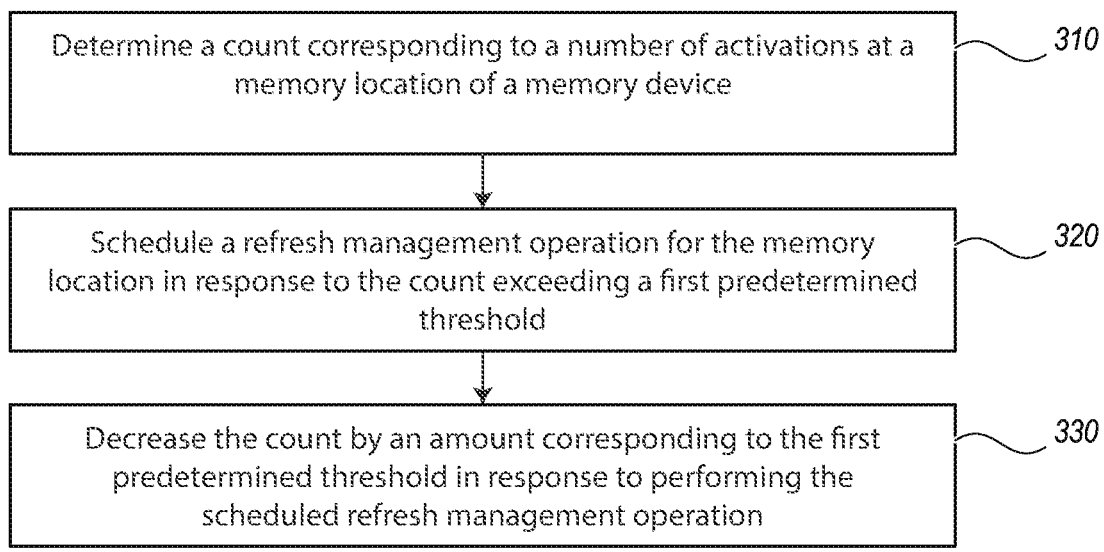
FIG. 3 is a flow chart illustrating a method of operating a memory system in accordance with an embodiment of the present technology.

FIG. 3 is a flow chart illustrating a method of operating a memory system in accordance with an embodiment of the present technology. The method includes determining a count corresponding to a number of activations at a memory location of a memory device (box 310). According to one aspect of the present disclosure, the determining features of box 310 may be implemented with a host device 210 and/or a controller 230, as illustrated in FIG. 2 in greater detail, above. The method further includes scheduling a refresh management operation for the memory location in response to the count exceeding a first predetermined threshold (box 320). According to one aspect of the present disclosure, the scheduling features of box 320 may be implemented with a host device 210 and/or a controller 230, as illustrated in FIG. 2 in greater detail, above. The method further includes decreasing the count by an amount corresponding to the first predetermined threshold in response to executing the scheduled refresh management operation (box 330). According to one aspect of the present disclosure, the decreasing features of box 330 may be implemented with a host device 210 and/or a controller 230, as illustrated in FIG. 2 in greater detail, above.

Figure 4:
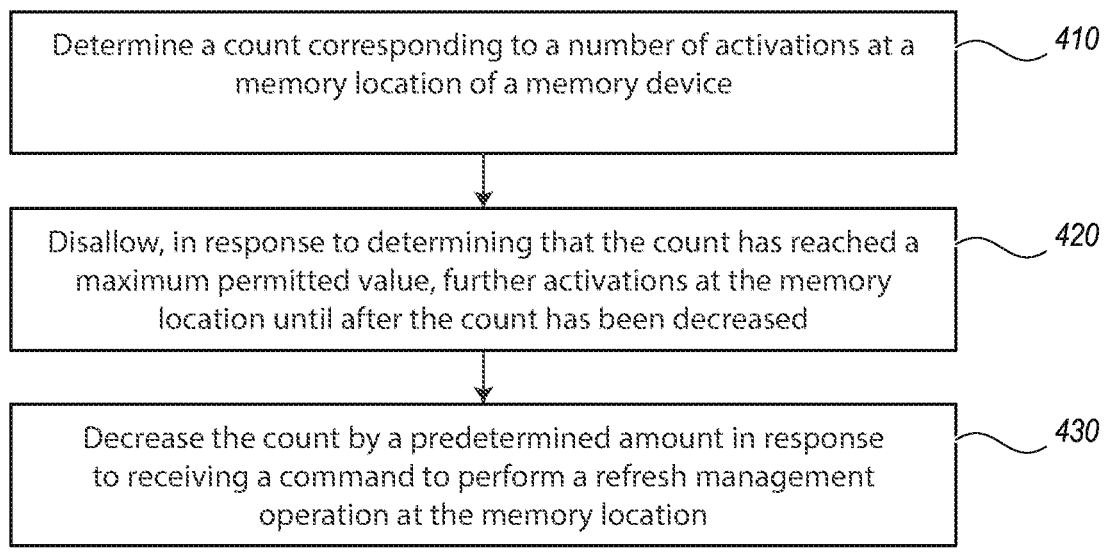
FIG. 4 is a flow chart illustrating a method of operating a memory device in accordance with an embodiment of the present technology.

FIG. 4 is a flow chart illustrating a method of operating a memory device in accordance with an embodiment of the present technology. The method includes determining a count corresponding to a number of activations at the memory location (box 410). According to one aspect of the present disclosure, the determining features of box 410 may be implemented with a controller 230, as illustrated in FIG. 2 in greater detail, above. The method further includes disallowing, in response to determining that the count has reached a maximum permitted value, further activations at the memory location until after the count has been decreased (box 420). According to one aspect of the present disclosure, the disallowing features of box 420 may be implemented with a controller 230, as illustrated in FIG. 2 in greater detail, above. The method further includes decreasing the count by a predetermined amount in response to receiving a command to execute a refresh management operation at the memory location (box 430). According to one aspect of the present disclosure, the decreasing features of box 430 may be implemented with a host device 210 and/or a controller 230, as illustrated in FIG. 2 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method, comprising:
   receiving a refresh command for a bank of a dynamic random access memory (DRAM) device;
   identifying a first value of a command bit in the refresh command, wherein the first value of the command bit indicates that the refresh command is a refresh management command for the bank of the DRAM device, and wherein an initial management threshold associated with the refresh management command is based on a value of a mode register of the DRAM device; and
   executing the refresh management command in response to identifying the first value of the command bit in the refresh command.

2. The method of claim 1, wherein the DRAM device comprises the mode register, the mode register operable to store the initial management threshold.

3. The method of claim 1, further comprising:
receiving periodic refresh commands; and
executing refresh operations in response to the periodic refresh commands.

4. A method, comprising:
monitoring for an activation command issued to a bank of a dynamic random access memory (DRAM) device;
incrementing, in response to the activation command, a rolling accumulated activations (RAA) count associated with the bank of the DRAM device; and
issuing, to the DRAM device, a refresh management command for the bank of the DRAM device in response to the RAA count exceeding an initial management threshold.

5. The method of claim 4, wherein a value of the initial management threshold is stored in a mode register of the DRAM device.

6. The method of claim 4, further comprising:
disallowing one or more additional activation commands associated with the bank in response to the RAA count exceeding an RAA maximum value.

7. The method of claim 6, further comprising:
permitting the one or more additional activation commands associated with the bank in response to the RAA count dropping below the RAA maximum value.

8. The method of claim 6, wherein the RAA maximum value is greater than the initial management threshold.

9. The method of claim 4, further comprising:
permitting one or more additional activation commands associated with the bank in response to the RAA count being less than an RAA maximum value.

10. The method of claim 4, further comprising:
decreasing, in response to the refresh management command, the RAA count by a quantity that is based on the initial management threshold.

11. The method of claim 10, wherein the quantity is equal to the initial management threshold.

12. The method of claim 4, further comprising:
decreasing, in response to the refresh management command, the RAA count and one or more other RAA counts associated with one or more other banks of the DRAM device by a quantity that is based on the initial management threshold.

13. The method of claim 4, further comprising:
decreasing, in response to the refresh management command, a plurality of RAA counts associated with each bank of a plurality of banks of the DRAM device, each RAA count of the plurality of RAA counts decreased by a quantity that is based on the initial management threshold.

14. The method of claim 4, further comprising:
issuing periodic refresh commands associated with the bank; and
decreasing, in response to issuing a refresh command of the periodic refresh commands, the RAA count associated with the bank by a quantity that is based on the initial management threshold.

15. The method of claim 4, wherein issuing the refresh management command comprises:
issuing, in response to the RAA count exceeding the initial management threshold, a refresh management all bank command for a plurality of banks of the DRAM device, the plurality of banks comprising the bank.

16. The method of claim 4, wherein issuing the refresh management command comprises:
issuing, in response to the RAA count exceeding the initial management threshold, a refresh management same bank command for the bank of the DRAM device.

17. The method of claim 4, wherein the initial management threshold is based on a value of a mode register of the DRAM device.

18. The method of claim 4, wherein the initial management threshold comprises a maximum activation count (MAC) threshold.

19. A memory system, comprising:
a dynamic random access memory (DRAM) device; and
a controller coupled with the DRAM device and operable to:
issue one or more activation commands for a bank of the DRAM device;
increase a rolling accumulated activations (RAA) count associated with the bank of the DRAM device in response to the one or more activation commands; and
issue a refresh management command for the bank in response to the RAA count exceeding an initial management threshold; and
wherein the DRAM device is operable to:
execute the one or more activation commands associated with the bank of a plurality of banks of the DRAM device; and
receive the refresh management command for the bank in response to a quantity of the one or more activation commands.

20. The memory system of claim 19, further comprising:
a mode register of the DRAM device, the mode register operable to store the initial management threshold.

21. The memory system of claim 19, wherein the controller is further operable to disallow one or more additional activation commands associated with the bank in response to the RAA count exceeding an RAA maximum value.

22. The memory system of claim 21, wherein the controller is further operable to permit the one or more additional activation commands associated with the bank in response to the RAA count dropping below the RAA maximum value.

23. The memory system of claim 21, wherein the RAA maximum value is greater than the initial management threshold.

24. The memory system of claim 21, wherein the controller is further operable to permit one or more additional activation commands associated with the bank in response to the RAA count being less than an RAA maximum value.

25. The memory system of claim 19, wherein the controller is further operable to decrease, in response to issuing the refresh management command, the RAA count by a quantity that is based on the initial management threshold.

26. The memory system of claim 25, wherein the quantity is equal to the initial management threshold.

27. The memory system of claim 19, wherein the controller is further operable to decrease, in response to the refresh management command, the RAA count and one or more other RAA counts associated with one or more other banks of the DRAM device by a quantity that is based on the initial management threshold.

28. The memory system of claim 19, wherein the controller is further operable to decrease, in response to the refresh management command, a plurality of RAA counts associated with each bank of the plurality of banks of the DRAM device, each RAA count of the plurality of RAA counts decreased by a quantity that is based on the initial management threshold.

29. The memory system of claim 19, wherein the controller is further operable to:
   issue periodic refresh commands associated with the bank; and
   decrease, in response to issuing a refresh command of the periodic refresh commands, the RAA count associated with the bank by a quantity that is based on the initial management threshold.

30. The memory system of claim 19, wherein, to issue the refresh management command, the controller is operable to issue, in response to the RAA count exceeding the initial management threshold, a refresh management all bank command for the plurality of banks of the DRAM device.

31. The memory system of claim 19, wherein, to issue the refresh management command, the controller is operable to issue, in response to the RAA count exceeding the initial management threshold, a refresh management same bank command for the bank of the DRAM device.

32. The memory system of claim 19, wherein the initial management threshold is based on a value of a mode register of the DRAM device.

33. The memory system of claim 19, wherein the DRAM device is further operable to execute a refresh management operation for at least the bank of the DRAM device in response to the refresh management command.

* * * * *